United States Patent [19]
Liu

[11] Patent Number: 5,889,302
[45] Date of Patent: Mar. 30, 1999

[54] MULTILAYER FLOATING GATE FIELD EFFECT TRANSISTOR STRUCTURE FOR USE IN INTEGRATED CIRCUIT DEVICES

[75] Inventor: Yowjuang William Liu, San Jose, Calif.

[73] Assignee: Advanced Micro Devices, Inc., Sunnyvale, Calif.

[21] Appl. No.: 837,556

[22] Filed: Apr. 21, 1997

[51] Int. Cl.[6] .................. H01L 29/788; H01L 29/792
[52] U.S. Cl. .................. 257/315; 257/316; 257/324; 257/350; 257/347; 257/351; 257/758; 257/760
[58] Field of Search .................. 257/758, 760, 257/347, 350, 351, 324, 315, 319, 321, 777, 314, 316, 326, 202, 774

[56] References Cited

U.S. PATENT DOCUMENTS

| | | | |
|---|---|---|---|
| 4,996,574 | 2/1991 | Shirasaki | 357/23.7 |
| 5,321,286 | 6/1994 | Koyama et al. | 257/315 |
| 5,346,834 | 9/1994 | Hisamoto et al. | 437/41 |
| 5,420,048 | 5/1995 | Kondo | 437/21 |
| 5,451,798 | 9/1995 | Tsuda et al. | 257/139 |
| 5,482,877 | 1/1996 | Rhee | 437/40 RG |
| 5,497,019 | 3/1996 | Mayer et al. | 257/347 |
| 5,581,101 | 12/1996 | Ning et al. | 257/347 |
| 5,612,552 | 3/1997 | Owens | 257/202 |
| 5,675,185 | 10/1997 | Chen et al. | 257/774 |
| 5,689,136 | 11/1997 | Usami et al. | 257/679 |

FOREIGN PATENT DOCUMENTS

| | | | |
|---|---|---|---|
| 61-180466 | 8/1986 | Japan | 257/350 |
| 3-288471 A | 12/1991 | Japan . | |

OTHER PUBLICATIONS

Patent Application for "Quadruple Gate Field Effect Transistor Structure for Use in Integrated Circuit Devices" Inventor Yowjuang W. Liu, Attorney Docket No. 60048–189, Filed Apr. 18, 1997, Serial No. 08/844,146.

Patent Application for "Multilayer Quadruple Gate Field Effect Transistor Structure for Use in Integrated Circuit Devices" Inventor Yowjuang W. Liu, Attorney Docket No. 60048–190, Filed Apr. 18, 1997, Serial No. 08/837,557.

*Primary Examiner*—William Mintel
*Attorney, Agent, or Firm*—Foley & Lardner

[57] ABSTRACT

A floating gate field effect transistor (FET) is provided on a semiconductor-on-insulator (SOI) or silicon-on-insulator structure. The silicon substrate is etched to form stepped structures upon which the transistors are formed. Layers of silicon substrate can be stacked upon each other to form a multi-layer system. Interlayer vias can be provided to connect each layer of the two-layer structure.

20 Claims, 5 Drawing Sheets

MULTILAYER FLOATING GATE FIELD EFFECT TRANSISTOR STRUCTURE FOR USE IN INTEGRATED CIRCUIT DEVICES

FIELD OF THE INVENTION

The present invention relates to integrated circuit devices. More particularly, the present invention relates to a multilayer integrated circuit structure including a floating gate field effect transistor.

BACKGROUND OF THE INVENTION

Semiconductor devices, such as, non-volatile memory circuits often include floating gate field effect transistors (FETs). For example, flash memory devices employ floating gate FETs which are arranged as a matrix of memory cells coupled together by word lines and bit lines. Each floating gate transistor generally includes a control gate, a floating gate, a drain, and a source. The word lines are coupled to the control gates of the transistors, and the bit lines are coupled to the drains of the transistors.

Floating gate FETs are generally bulk semiconductor-type devices in contrast to semiconductor-on-insulator-type devices, such as, silicon-on-insulator (SOI) devices. The FETs are disposed in a single plane on a top surface of a semiconductor substrate such as a silicon substrate.

In bulk semiconductor-type devices which have lateral floating gate FETs, the top surface of the substrate is doped to form source and drain regions, and a conductive layer is provided over a floating gate on the top surface of the semiconductor substrate between the source and drain regions to operate as the control gate. The number of layers of lateral floating gate FETs is limited to one layer (e.g., the top surface). Additionally, the anisotropic nature of the top surface of the silicon substrate due to the conductive layer limits the number of metal layers and insulative layers which can be provided over the lateral FETs.

Bulk semiconductor-type devices can be subject to some disadvantageous properties, such as, less than ideal subthreshold voltage slope during operation, high junction capacitance, and ineffective isolation. Additionally, bulk semiconductor-type devices often require epilayers, P-wells, or N-wells which require additional fabrication steps.

Semiconductor-on-insulator (SOI) (e.g., silicon-on-insulator) devices have significant advantages over bulk semiconductor-type devices, including near ideal subthreshold voltage slope, low junction capacitance, and effective isolation between devices. SOI-type devices generally completely surround a silicon or other semiconductor substrate with an insulator. Devices, such as, conventional FETs or other transistors, are disposed on the silicon by doping source and drain regions and by providing gate conductors between the source and drain regions. SOI devices provide significant advantages, including reduced chip size or increased chip density, because minimal device separation is needed due to the surrounding insulating layers. Additionally, SOI devices can operate at increased speeds due to reductions in parasitic capacitance.

Conventional SOI devices generally have a floating substrate (the substrate is often totally isolated by insulating layers). Accordingly, SOI devices are subject to floating substrate effects, including current and voltage kinks, thermal degradation, and large threshold voltage variations. SOI devices also can have some limited packing densities because they are limited in vertical integration. Generally, SOI devices are only comprised of a single SOI layer and do not include floating gate FETs for use in non-volatile memory applications such as flash memory.

Thus, there is a need for an SOI or bulk semiconductor device which has improved density and improved vertical integration. Further, there is a need for an SOI device which includes a floating gate FET which has increased operating speed. Further still, there is a need for a multilayer SOI or bulk semiconductor device which contains floating gate FETs.

SUMMARY OF THE INVENTION

The present invention relates to an integrated circuit including a first semiconductor-on-insulator layer and a second semiconductor-on-insulator layer. The first semiconductor-on-insulator layer includes a first semiconductor substrate and a first floating gate. The first semiconductor substrate contains a first channel region situated adjacent the first floating gate. The first semiconductor substrate is disposed between a first insulating layer and a second insulating layer. The second semiconductor-on-insulator layer includes a second semiconductor substrate and a second floating gate. The second semiconductor substrate contains a second channel region situated adjacent the second floating gate. The second semiconductor substrate is disposed between a third insulating layer and a fourth insulating layer. The fourth insulating layer is in contact with the first insulating layer. The first semiconductor substrate is stacked below the second semiconductor substrate.

The present invention further relates to a multilayer for containing a plurality of floating gate transistors. The multilayer structure includes a first layer and a second layer. The first layer includes a first semiconductor substrate and a first floating gate. The first semiconductor substrate contains a first channel region situated adjacent the first floating gate. The first semiconductor substrate is at least partially surrounded by an insulative material. The second layer includes a second semiconductor substrate. The second semiconductor substrate contains a second channel region. The second semiconductor substrate is at least partially surrounded by an insulative material. The first semiconductor substrate is stacked below the second semiconductor substrate, and the first layer is bonded to the second layer.

The present invention still further relates to a method of making a multilayer structure for containing a plurality of floating gate transistors. The method includes providing a first layer including a first semiconductor substrate, a first control gate layer, and a first floating gate, providing a second layer including a second semiconductor substrate, a second control gate layer and a second floating gate, attaching the first layer to the second layer, and electrically coupling the first via to the second via. The first semiconductor substrate contains a first channel region situated adjacent the first floating gate. The first semiconductor substrate is at least partially surrounded by an insulating material. The first control gate layer is electrically coupled to a first via. The second semiconductor substrate contains a second channel region situated adjacent the second floating gate. The second semiconductor substrate is at least partially surrounded by an insulating material. The second control gate is electrically coupled to a second via.

In one aspect of the present invention, a SOI floating gate FET device has near ideal subthreshold voltage slope, low junction capacitance, an effective isolation as well as increased current density. The FET device can have a non-floating (e.g., a biased) substrate to reduce floating substrate effects, such as, current and voltage kinks, thermal degradation, and large voltage variations. The floating gate transistor is an N-channel transistor and can be utilized as part of a flash memory array. The floating gate transistor can also be a P-channel transistor.

In accordance with another aspect of the present invention, epilayers, N-wells, and P-wells are not required, thereby making the device easier to manufacture. Requirements for special polydoping and boron penetration are also not necessary. The floating gate FET can be self-aligned to source and drain regions, thereby achieving higher core gains and smaller cell size than in conventional processes.

In accordance with a further aspect of the present invention, a method of stacking floating gate FET structures increases packing density by allowing essentially unlimited vertical integrations. The vertical integrations are not limited by lithography considerations. A first SOI layer can be stacked and bonded to a second SOI layer. The layers are coupled by interlayer vias which extend into both layers.

BRIEF DESCRIPTION OF THE DRAWINGS

Preferred embodiments of the invention ill hereinafter be described in conjunction with the appended drawings wherein like numerals denote like elements.

DETAILED DESCRIPTION OF THE PREFERRED EMBODIMENTS

Figure 1:
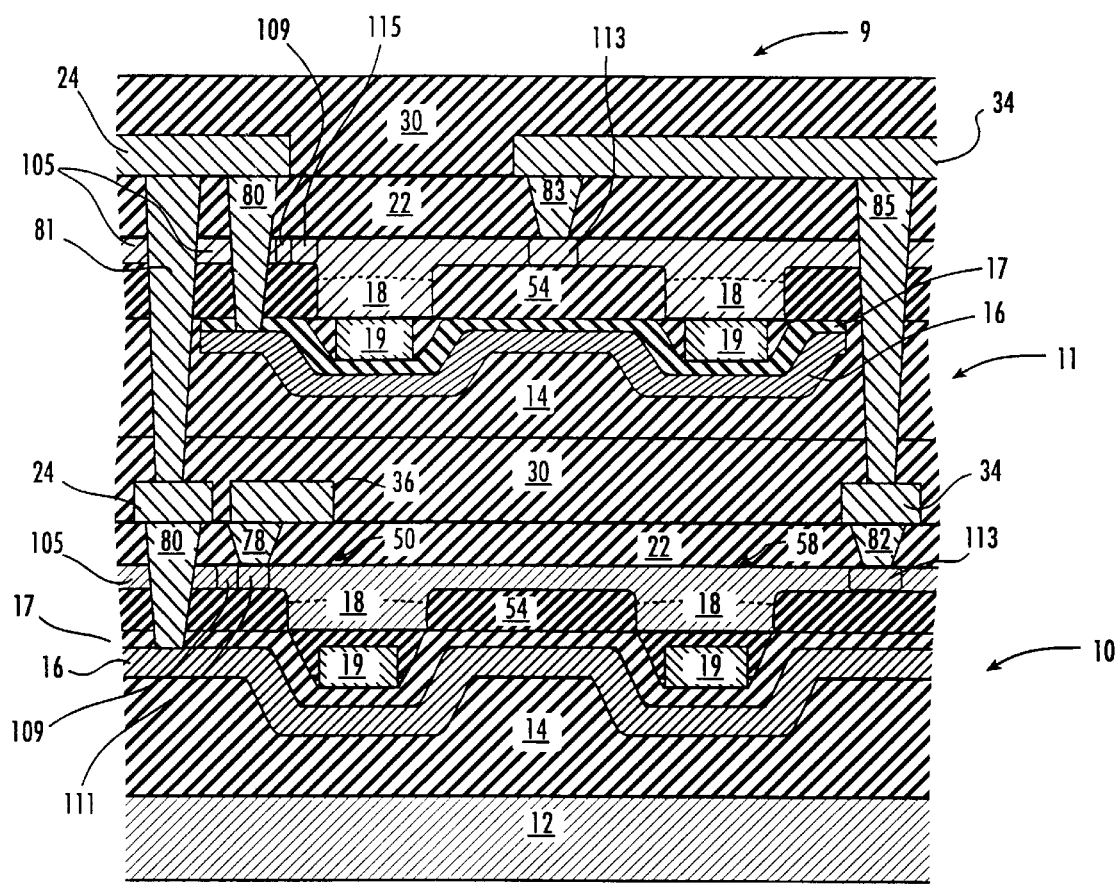
FIG. 1 is a cross-sectional view of a multilayer integrated circuit in accordance with an exemplary embodiment of the present invention.
Figure 2:
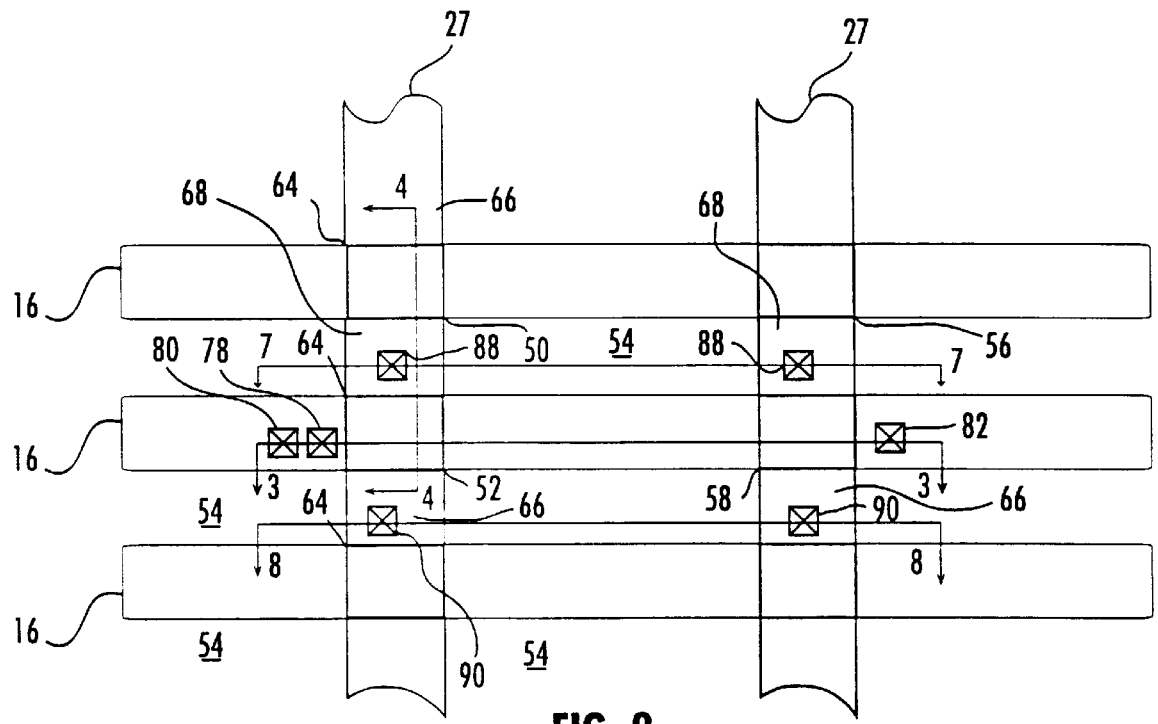
FIG. 2 is a top view of a layer of the integrated circuit illustrated in FIG. 1.

With reference to FIGS. 1 and 2, a multilayer SOI integrated circuit 9 includes a first integrated circuit 10 and a second integrated circuit 11. Circuit 10 is preferably a first SOI layer, and circuit 11 is preferably a second SOI layer. Circuit 10 is stacked below second integrated circuit 11.

A first semiconductor-on-insulator (SOI) layer or circuit 10 includes a support substrate 12, an insulating layer 14, a conductive layer 16, a dielectric layer 17, a bit line 27 (not shown in FIGS. 1 and 3–8), a silicon substrate 18, an insulating layer 22, a conductive layer 24, and an insulating layer 30. FIG. 2 shows a top view of circuit 9. FIG. 1 is a cross-section associated with line 3–3 in FIG. 2.

Support substrate 12 can be a semiconductor material, an insulating material, or other substance that provides a base for integrated circuit 10. Support substrate 12 can be silicon dioxide, silicon, or a flexible material. Support substrate 12 is attached to insulating layer 14 by an adhesive or by other bonding material, and substrate 12 is preferably a flexible material (e.g., fiberglass).

Insulating layers 14, 22 and 30 can be any dielectric or insulating material. Preferably, layers 14, 22 and 30 are a deposited high-temperature oxide, such as, TEOS-based oxide, silicon dioxide, spin-on-glass (SOG), PECVDTEOS oxide, SiH-based, PECVD oxide, or a two-layer glass and nitrite material. Dielectric layer 17 is preferably an oxide nitride oxide (ONO) sandwich, or other insulating layer.

Conductive layers 16 and 24 are preferably doped polysilicon or polycide layers. Alternatively, layers 16 and 24 can be any conductive material, such as, titanium, amorphous silicon, metal, tungsten, or other conductor. Layers-16 and 24 can be deposited by dipping, evaporation, collimated sputtering, physical vapor deposition, sputter deposition, chemical vapor deposition (CVD), or other deposition techniques. Furthermore, layers 16 and 24 can also be a sandwich structure that includes polycide and polysilicon layers to reduce resistivity. Layers 36 and 34 are similar to layer 24 and provided on top of layer 22 to provide signals to parts of transistors 50 and 58.

As shown in FIGS. 1 and 2, in an exemplary fashion only, integrated circuit 10 includes floating gate field effect transistor 50, 52, 56 and 58. Transistors 50, 52, 56 and 58 are provided on substrate 18. Substrate 18 is preferably silicon and is divided into stepped structures 106 (FIG. 3) separated by oxide regions 54, although cylindrical or other geometries for these portions of substrate 18 are possible.

With reference to FIG. 2, each of transistors 50, 52, 56 and 58 are comprised of a gate region 64, a source region 66, and a drain region 68. Gate region 64 is provided between regions 66 and 68 and represents a channel region for transistors 50. Regions 66 and 68 are preferably doped semiconductor regions provided in substrate 18. Transistors 50, 52, 56 and 58 can be a N-channel, a P-channel, or other type of transistor. The isolation associated with layers 14 and oxide regions 54 enables transistors 50, 52, 56 and 58 to have low junction capacitance relative to conventional bulk-type semiconductor devices.

Figure 3:
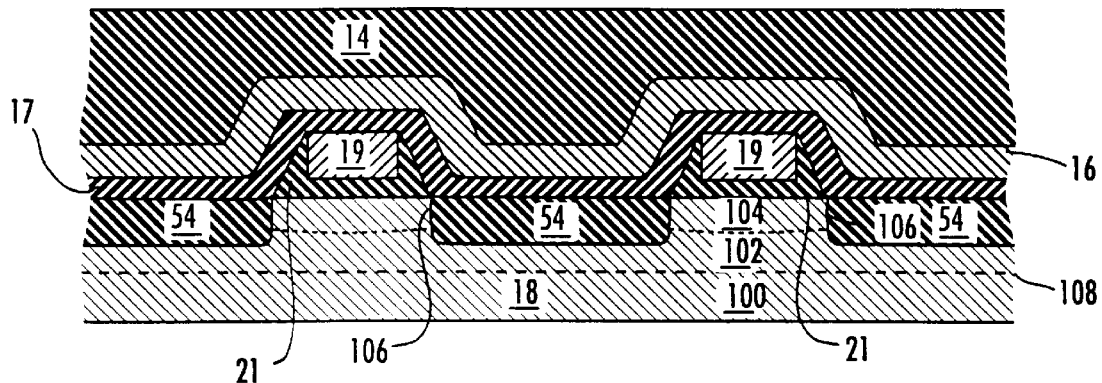
FIG. 3 is a cross-sectional view of the substrate associated with the layer illustrated in FIG. 2 about line 3—3.

With reference to FIGS. 1, 2, and 3, gate 64 of transistor 50 is advantageously formed by a conductive layer 19. Conductive layer 16 is formed over a gate oxide spacer or layer 21 (FIG. 3), which is preferably a thermally grown oxide. Layers 17 and 19 provide a floating gate structure for transistor 50.

Layer 16 essentially is provided around layer 19 and forms a control gate for transistors 50 and 58. The control gate is preferably coupled to a word line in circuit 10. With reference to FIGS. 1 and 2, a via 80 couples layer 24 to layer 16. A via 78 couples layer 36 to substrate 18, and a via 82 couples layer 34 to substrate 18. Thus, layer 167 can be coupled to the word line (not shown) associated with integrated circuit 10 through via 80.

Substrate 18 is preferably a P-type dopant which is heavily doped with P-type dopants below a dashed line 108 (FIG. 3). Additionally, substrate 18 is doped with N-type dopants at a region 105 (FIG. 1) surrounding via 80. A region 109 between region 105 and a region 111 is doped with P-type dopants. Region 111 is doped with N-type dopants and is coupled to conductive via 78. Via 82 is coupled to a region 113 which is heavily doped with P-type dopants. Doped regions 105, 107, 109, and 111 provide proper isolation for substrate 18.

Vias 90 and 88 (FIG. 2) can be coupled to each source region 66 and drain region 68, respectively, associated with transistors 50, 52, 56 and 58. Layers 34 and 36 are preferably silicide. Alternatively, layers 34 and 36 can be metal, aluminum, gold, polysilicon, or other conductive material.

Layer 34 can provide a substrate bias signal to the channel region of transistor 50. Via 78 (e.g., isolated from via 80) couples layer 36 to the channel region of transistor 50. Similarly, via 82 couples layer 34 to the channel region of transistor 58. Substrate 18 associated with transistors 50 and 58 is, thus, biased through vias 78 and 82. Therefore, floating substrate effects can be reduced with respect to transistors 50 and 58 because substrate 18 is not a floating substrate. A via (not shown) similar to via 78 can also be coupled to substrate 18 to provide a biased signal to the channel region of other transistors. Integrated circuit 10 provides significant advantages, including most of the advantages associated with integrated circuits manufactured from SOI techniques, and yet eliminates floating substrate problems by the use of vias 78 and 82 associated with transistors 50 and 58.

Integrated circuit 9 illustrated in FIG. 1 has a high density layout because circuits 10 and 11 are stacked on each other. Additionally, circuit 10 is fully planarized (on both sides) by planarization techniques such as a chemical mechanical planarization process. The fully planarized structure allows for greater integration and multiple level SOI devices.

Circuit 11 (FIG. 1) (e.g., second SOI layer) is preferably similar to circuit 10 both in composition and in structure. However, second integrated circuit 11 further includes an interlayer via 81, a via 83, and an interlayer via 85 (instead of a via 82). Furthermore, there is no support substrate 12 between circuits 10 and 11.

Conductive layers 24 and 34 in the second circuit 11 are disposed over insulating layer 22. Conductive layer 24 of circuit 10 is coupled to interlayer via 81 and to via 80 of circuit 10. Interlayer via 85 couples conductive layer 34 of the second circuit 11 to layer 34 of the first circuit 10. Additionally, layer 34 of circuit 11 is coupled to via 83 which is coupled to region 113 of substrate 18 of circuit 11. Region 113 is heavily doped with p-type dopants.

Just as in the exemplary embodiment of first integrated circuit 10, top insulating layer 30 of second integrated circuit 11 is disposed over conductive layers 24 and 34 and over any exposed surface of insulating layer 22. A metal layer (not shown) can be provided over layer 30. The metal layer can provide various interconnections for structures on circuits 10 and 11. With reference to FIG. 1, via 80 is isolated from substrate 18 of circuit 11 by an NPN structure comprised of region 105, region 109, and region 115.

The manufacture of integrated circuit 10 is discussed with reference to FIGS. 1–8 below. In FIG. 3, substrate 18 is shown before circuit 10 is completed. Substrate 18 includes a heavily doped region 100 (P+) a lightly doped region 102 (P–), and a doped region 104 (P). However, in FIG. 3, integrated circuit 10 is shown without layer 34, layer 24, vias 78, 80 and 82, and in an upside orientation relative to FIGS. 1, 2, and 4–8. Before stepped structures 106 are formed, a tunnel oxide, dielectric layer, or layer 21 is provided on top of substrate 18.

Floating gate structures for transistors 50, 52, 56 and 58 are created by providing conductive layer 19 on top of layer 21. Layer 19 is then etched to form conductive lines associated with the floating gate structure. Next, an oxide layer is provided over the conductive lines associated with layer 19 and etched to leave spacers on the sides of layer 19. Thus, the conductive lines associated with layer 19 are essentially surrounded on three sides by insulated material. The floating gate structure has improved gate charge retention characteristics because of the insulation surrounding the conductive lines associated with layer 19.

Stepped structures 106 are formed in substrate 18 by trench isolation techniques formed with spacer protection to the tunnel oxide and gate edges associated with transistors 50 and 58. After structures 106 are formed, an insulative layer is deposited to fill oxide regions 54.

Stepped structures 106 are formed above a boundary line 108 between lightly doped region 102 and heavily doped region 100. Substrate 18 is preferably etched or otherwise shaped to form stepped structures 106. Substrate 18 can be etched by reactive ion etching (RIE), directional dry etching, planarization, trench, solution techniques or other removal techniques to form structures 106.

After structures 106 are etched into substrate 18, layer 17 is deposited over layer 19 and conductive layer 16 is deposited over layer 17. Insulating layer 14 is deposited over layer 16. Layer 14 can be 0.5 to 2 microns thick and completely covers layer 16. Layer 14 is preferably polished back to form a smooth surface. The thickness of layer 14 can affect the heat conductivity and coupling capacitance associated with circuit 10.

Figure 8:
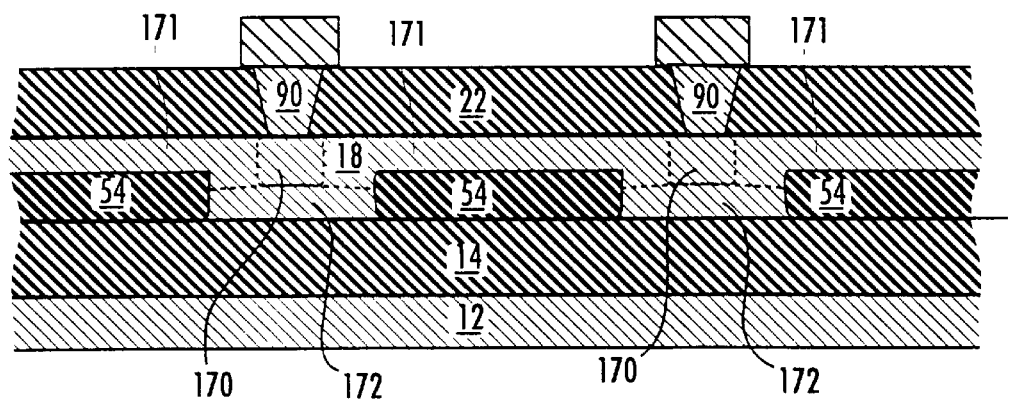
FIG. 8 is a cross-sectional view of the integrated circuit illustrated in FIG. 2 about line 8—8.
Figure 4:
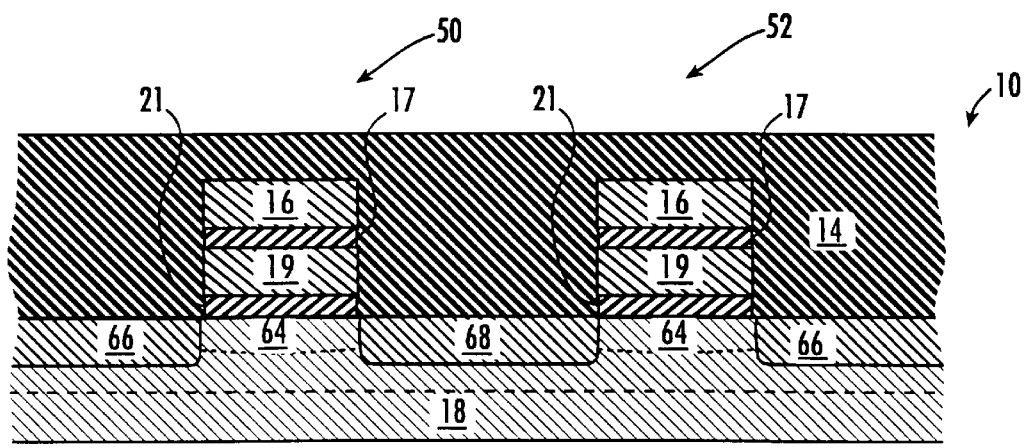
FIG. 4 is a cross-sectional view of the layer illustrated in FIG. 2 about line 4—4 when the substrate is being edged.

With reference to FIG. 4, a cross-section of integrated circuit 10 including transistors 50 and 52 is shown. The floating gate structures associated with layers 19 and 21 are provided over a channel region associated with substrate 18. Gate 64 is preferably a P-type region of substrate 18 and drain 68 and sources 66 are heavily doped N-type regions. Preferably, a self-aligned source (SAS) etch is utilized to remove oxide between source junctions followed by an N-plus implant to connect all source junctions to dope a portion 171 of substrate 18 (FIG. 8). The etching of substrate 18 to form step structures 106 is preferably formed after the first polysilicon layer is etched (e.g., layer 19) and utilizes the first polysilicon mask to achieve self-aligned floating gates to the active source and drain regions 66 and 68 of transistors 50 and 52 (FIG. 4).

Figure 5:
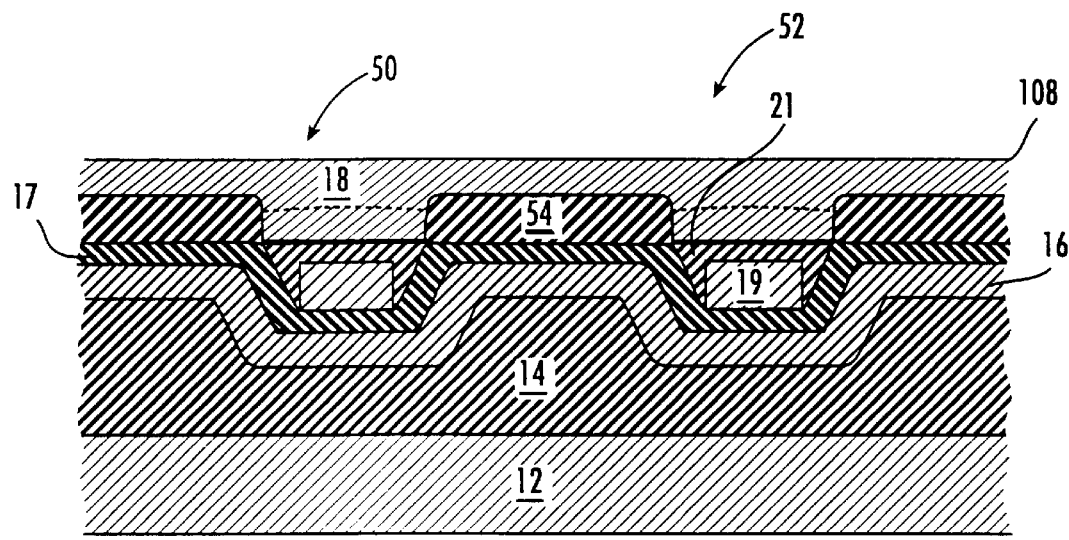
FIG. 5 is a cross-sectional view of the integrated circuit illustrated in FIG. 3 after the substrate is etched and before the second gate conductor layer is provided.

Integrated circuit 10 is flipped over from its orientation in FIGS. 3 and 4 and bonded to support substrate 12 (FIG. 5). Substrate 18 of integrated circuit 10 is polished to remove heavily doped region 100 to boundary line 108. Boundary line 108 provides an etch stop area for chemical, mechanical polishing of substrate 18.

Figure 6:
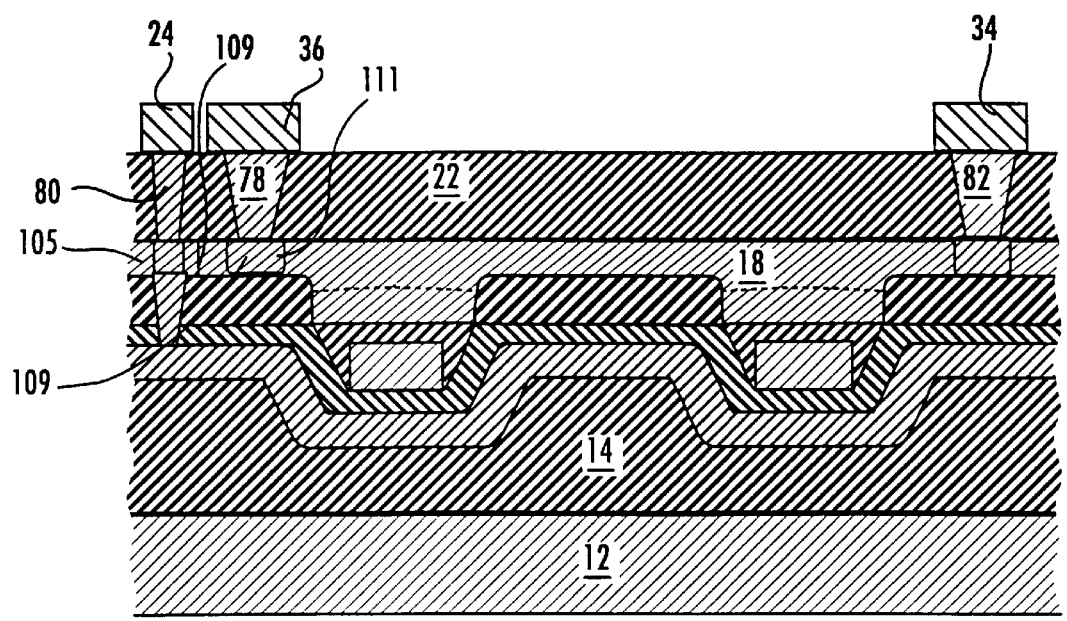
FIG. 6 is a cross-sectional view of the integrated circuit illustrated in FIG. 5 after the second gate conductor layer is provided.

With reference to FIG. 6, insulative layer 22 is deposited over substrate 18. Conductive layers 24, 34 and 36 are provided on top of layer 22. Preferably, vias 78, 80, and 82 are formed in layer 22 before layers 24 and 34 are deposited.

Figure 7:
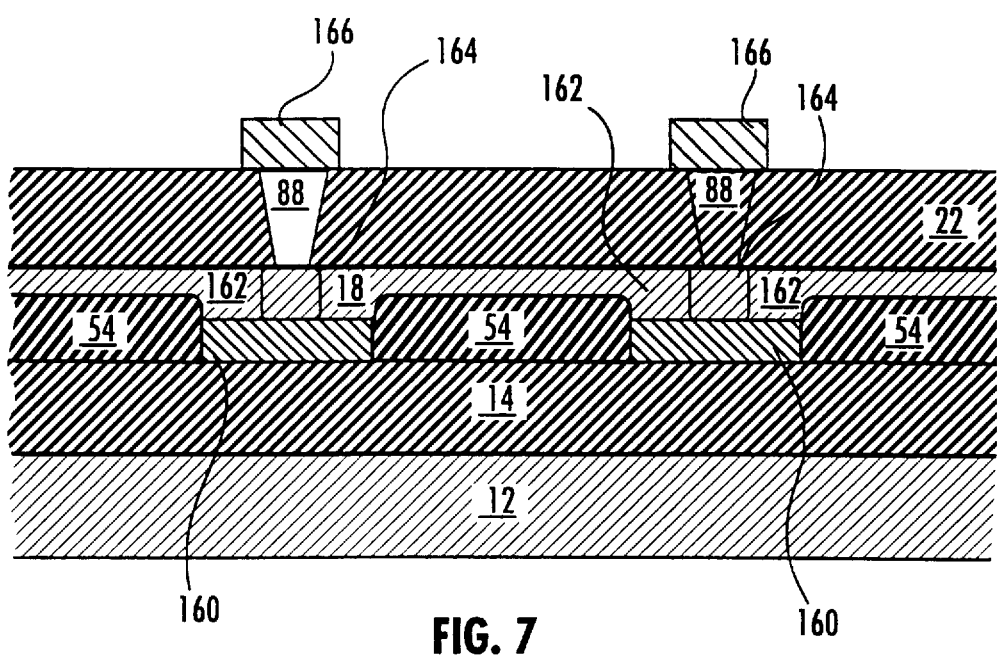
FIG. 7 is a cross-sectional view of the integrated circuit illustrated in FIG. 2 about line 7—7.

With reference to FIG. 7, vias 88 for drains are provided for transistors 50 and 56 (FIG. 2). Substrate 18 preferably has a heavily doped N-type region (N++) 160 below lightly doped P-regions 162 (P–). Heavily doped N-type region 164 couple regions 160 to vias 88. A conductive layer 166 can be coupled to vias 88.

With reference to FIG. 8, vias 90 (FIG. 2) provide source contacts for transistors 52 and 58. Vias 90 are coupled to a heavily doped N-plus region (N+ region) 170 provided over a heavily doped (N++ region) 172. Substrate 18 is doped with N-type doping to be an N+ region at portion 171.

The manufacture of second integrated circuit 11 is preferably similar to the manufacture of first SOI circuit 10 both in composition-and in dimensions, as just described above. The additional steps required to make the interconnections between the stacked circuits are discussed with reference to FIG. 1. Just as with first circuit 10, support substrate 12 of the second circuit 11 is initially bonded to the base insulating layer 14 and supports the growing structure of SOI circuit 11 as it is built. However, with second circuit 11, support substrate 12 is temporarily bonded to base insulating layer 14 and is subsequently removed after layer 30 is provided over layers 22 and 24.

Once support substrate 12 is removed from the second circuit 11, insulating layer 14 of circuit 11 is bonded with an adhesive to top insulating layer 36 of the first circuit 10 to form circuit 9. Layer 22 of circuit 11 is then etched to provide holes for conductive vias 80, 81, 83, and 85. Layers 30, 22, and 14 of circuit 11 and layer 36 of circuit 10 are progressively etched to provide holes for interconductive vias 81 and 85.

The precise alignment of integrated circuits 10 and 11 is necessary for proper operation of circuit 9. As wafer sizes become larger such as greater than 8 inches in diameter, alignment problems may become more difficult. However, the use of interlayer via 81 coupling to a conductive layer 34 instead of another via provides a larger area for making the connection between circuits 10 and 11.

It is understood that, while the detailed drawings and specific examples describe the exemplary embodiments of the present invention, they are there for the purpose of illustration only. The apparatus and method of the invention is not limited to the precise details, geometries, dimensions, materials, and conditions disclosed. For example, although particular layers are described as being particular sizes, other sizes can be utilized. Further, although the example given is limited to stacking two silicon-on-insulator (SOI) integrated circuits, other polarities of SOI circuits can be stacked. Further still, although polysilicon is used as a gate conductor, other conductor materials can be utilized. Even further still, the drawings are not drawn to scale. Various changes can be made to the precise details discussed without departing from the spirit of the invention which is defined by the following claims.

What is claimed is:

1. A flash memory integrated circuit, comprising:
   a first semiconductor-on-insulator layer including a first insulating layer above a first conductive layer above a first semiconductor substrate above a first floating gate above a first control gate above a second insulating layer, the first semiconductor substrate containing a first channel region situated above the first floating gate; and
   a second semiconductor-on-insulator layer including a third insulating layer above a second conductive layer above a second semiconductor substrate above a second floating gate, above a second control gate above a fourth insulating layer, the second semiconductor substrate containing a second channel region situated above the second floating gate, the fourth insulating layer being in contact with the first insulating layer, wherein the first semiconductor substrate is stacked below the second semiconductor substrate.

2. The integrated circuit of claim 1 wherein the first control gate is disposed over three sides of the first floating gate.

3. The integrated circuit of claim 2 wherein the first control gate is coupled to the second control gate by an interlayer via extending through the first semiconductor substrate.

4. The integrated circuit of claim 1 wherein the fourth insulating layer and the first insulating layer are bonded by an adhesive.

5. The integrated circuit of claim 3 wherein the first conductive layer is a silicide layer and the interlayer via is coupled to the silicide layer.

6. The integrated circuit of claim 5 wherein the first substrate is coupled to a substrate via to receive a substrate bias signal.

7. The integrated circuit of claim 3 wherein the interlayer via is separated from the first channel region by a doped region isolating the interlayer via from the first channel region.

8. A multilayer structure for containing a plurality of floating gate transistors, the multilayer structure comprising:
   a first layer including a first insulative layer above a first conductive layer above a first semiconductor substrate above a first floating gate above a first control gate above a second insulative layer, the first semiconductor substrate being at least partially surrounded on three sides by the first control gate; and
   a second layer including a third insulative layer above a second conductive layer, above a second semiconductor substrate, above a second floating gate above a second control gate above a fourth insulative layer, the second semiconductor substrate containing a second channel region, the second semiconductor substrate being at least partially surrounded on three sides by the second control gate, wherein the first semiconductor substrate is stacked below the second semiconductor substrate and the first insulative layer is bonded to the fourth insulative layer.

9. The multilayer structure of claim 8 wherein a conductive via is disposed through the second layer into the first layer, the conductive via being electrically coupled to the first substrate and the second substrate.

10. The multilayer structure of claim 9 wherein the conductive via is disposed through the second substrate.

11. The multilayer structure of claim 10 wherein the first control gate and the second control gate are coupled by a control via, the control via extending at least partially through the first layer and the second layer.

12. The multilayer structure of claim 8 wherein the first layer and the second layer are bonded by an adhesive.

13. The multilayer structure of claim 11 wherein the first control gate is a silicide material.

14. The multilayer structure of claim 12 wherein the first floating gate is a polysilicon material.

15. The multilayer structure of claim 13 wherein the first floating gate and the first control gate are separated by a dielectric layer, the dielectric layer being an oxide-nitride-oxide material.

16. A multilayer structure for containing a plurality of floating gate transistors, the multilayer structure being fabricated by a method comprising:
   providing a first layer including a first insulative layer above a first conductive layer, above a first semiconductor substrate, above a first floating gate, above a first control gate, above a second insulative layer, the first semiconductor substrate containing a first channel region situated adjacent the first floating gate, the first semiconductor substrate being at least partially surrounded by the first control gate, the first control gate being electrically coupled to a first via;
   providing a second layer including a third insulative layer above a second conductive layer, above a second semiconductor substrate, above a second floating gate, above a second control gate, above a fourth insulative layer, the second semiconductor substrate containing a second channel region situated adjacent the second floating gate, the second semiconductor substrate being at least partially surrounded by the second control gate, the second control gate being electrically coupled to a second via;

attaching the first layer to the second layer; and electrically coupling the first via to the second via.

17. The multilayer structure of claim 16 wherein the first layer includes a first support substrate and the second layer includes a second support substrate, wherein the second support substrate is attached to the second layer by a temporary bond and the second support substrate is removed prior to the attaching step.

18. The multilayer structure of claim 16 wherein the first via is coupled to a first suicide layer and the second via is coupled to a second silicide layer.

19. The multilayer structure of claim 18 wherein the method further comprises:

providing an interlevel conductive via, the interlevel conductive via being coupled to the first silicide layer and the second silicide layer.

20. The multilayer structure of claim 16 wherein the method further comprises:

depositing an insulating layer over the second layer; and providing a metal layer over the insulating layer.

* * * * *